: US008809960B2

United States Patent
Won

(10) Patent No.: US 8,809,960 B2
(45) Date of Patent: Aug. 19, 2014

(54) SEMICONDUCTOR DEVICE AND METHOD FOR MANUFACTURING

(71) Applicant: SK Hynix Inc., Icheon (KR)

(72) Inventor: Sang Min Won, Seosan (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/717,546

(22) Filed: Dec. 17, 2012

(65) Prior Publication Data
US 2014/0061805 A1    Mar. 6, 2014

(30) Foreign Application Priority Data
Aug. 31, 2012    (KR) .................. 10-2012-0096485

(51) Int. Cl.
*H01L 27/088*    (2006.01)

(52) U.S. Cl.
USPC ........................................ 257/368

(58) Field of Classification Search
CPC ............ H01L 27/088; H01L 29/66666; H01L 29/66712

USPC ................... 257/302, 329, 368, 369; 438/269
See application file for complete search history.

(56) References Cited

U.S. PATENT DOCUMENTS

| 6,624,032 B2 | 9/2003 | Alavi et al. |
| 2009/0218604 A1 | 9/2009 | Hwang |

FOREIGN PATENT DOCUMENTS

| KR | 10-2002-0002060 A | 1/2002 |
| KR | 10-0955183 | 4/2010 |

*Primary Examiner* — Whitney T Moore

(57) ABSTRACT

A semiconductor device includes a gate structure penetrating an interlayer insulating layer formed on a semiconductor substrate, an epitaxial growth layer grown on the interlayer insulating layer, a first transistor including a first channel region in the semiconductor substrate formed by a bias applied to source/drain contacts penetrating the interlayer insulating layer, and a second transistor including a second channel region formed in the epitaxial growth layer by the bias applied to the source/drain contacts and sharing the gate structure. A current flowable path flows more current at any given time, so that operation current is increased and operation speed is improved. A smaller area of the semiconductor device is necessary to cause the current to flow, and the effective net die area is increased.

27 Claims, 5 Drawing Sheets

SEMICONDUCTOR DEVICE AND METHOD FOR MANUFACTURING

CROSS-REFERENCE TO RELATED APPLICATION

The present application claims priority to Korean patent application number 10-2012-0096485, filed on 31 Aug. 2012, which is incorporated by reference in its entirety.

BACKGROUND

With the high integration of the semiconductor devices, characteristics of the semiconductor devices can be degraded, in particular, operation current of a transistor in a peripheral circuit area may be reduced and a speed of the semiconductor device may be reduced. That is, the factor related to current flow at any given time may be degraded and this total speed of the semiconductor reduced.

To improve the speed of the semiconductor device, new technology such as a junctionless transistor has suggested, but it may be difficult to apply the new technology to the current structure of the semiconductor device and to integrate the junctionless transistor currently.

As the semiconductor device is highly integrated, a gate insulating layer having a thin thickness can suppress a short channel effect and adjust a threshold voltage in the transistor. However, as the thickness of the gate insulating layer is thinned, leakage current of the transistor may be increased by tunneling of a gate electrode, or a failure such as dielectric breakdown in the gate insulating layer can occur.

A high dielectric (high-k) material may be applied as the gate insulating layer to address the above-described issue. With application of the high-k gate insulating layer, it is possible to suppress the short channel effect and to adjust the threshold voltage in the transistor with stable characteristics for the leakage current and dielectric breakdown generated in the gate insulating layer. Thus miniaturization, high integration, and high speed operation of the semiconductor device are possible.

However, the application of the high-k gate insulating layer may not improve leakage current of the transistor by gate-induced drain leakage (GIDL) due to concentration of the electric field generated in an overlapping region of the drain and gate, and the high integration of the semiconductor device may be difficult.

SUMMARY

One or more exemplary embodiments address reduction in operation speed of a semiconductor device by reduction in operation current in a peripheral circuit area.

According to one aspect of an exemplary embodiment, there is provided a semiconductor device. The semiconductor device may include: a gate structure penetrating an interlayer insulating layer formed on a semiconductor substrate; an epitaxial growth layer grown from the semiconductor substrate and present within the interlayer insulating layer; a first transistor including a first channel region formed in the semiconductor substrate by a bias applied to source/drain contacts that penetrate the interlayer insulating layer; and a second transistor including a second channel region formed in the epitaxial growth layer by the bias applied to the source/drain contacts and sharing the gate structure with the first transistor.

The semiconductor device may further include first ion implantation regions in the semiconductor substrate spaced by the gate structure.

The first channel region may be formed between the first ion implantation regions.

The semiconductor device may further include second ion implantation regions in the epitaxial growth layer spaced by the gate structure.

The second channel region may be formed between the second ion implantation regions.

The source/drain contacts may connect the first ion implantation regions with second ion implantation regions.

The gate structure may include a stacking structure of a first gate oxide layer, a first polysilicon layer, a gate metal layer, a second polysilicon layer, and a second gate oxide layer formed on the semiconductor substrate.

The first transistor and the second transistor may have a symmetrical structure on the basis of the gate metal layer.

The first transistor may include the first ion implantation regions, the first gate oxide layer, the first polysilicon layer, and the gate metal layer.

The second transistor may include the second ion implantation regions, the second gate oxide layer, the second polysilicon layer, and the gate metal layer.

The semiconductor device may further provide metal contacts on the contact plugs.

The epitaxial growth layer is connected to the semiconductor substrate to be grown and penetrate the interlayer insulating layer.

The gate structure and the source/drain contacts may be spaced from each other.

The semiconductor device may further include contact plugs penetrating the epitaxial growth layer on the source/drain contacts.

According to another aspect of an exemplary embodiment, there is provided a semiconductor device. The semiconductor device may include: first ion implantation regions provided in a semiconductor substrate; a gate structure penetrating an interlayer insulating layer provided on the semiconductor substrate; an epitaxial growth layer formed on the interlayer insulating layer using the semiconductor substrate as a seed layer; second ion implantation regions provided in the epitaxial growth layer; and source/drain contacts connecting the first ion implantation regions with second ion implantation regions with the first transistor.

The gate structure may include a stacking structure of a first gate oxide layer, a first polysilicon layer, a gate metal layer, a second polysilicon layer, and a second gate oxide layer provided on the semiconductor substrate.

A first channel region may be formed between the first ion implantation regions when a bias is applied to the source/drain contacts.

A second channel region may be formed between the second ion implantation regions when a bias is applied to the source/drain contacts.

The gate structure may be spaced from the source/drain contacts.

The epitaxial growth layer may penetrate the interlayer insulating layer.

The semiconductor device may further include contact plugs penetrating the epitaxial growth layer on the source/drain contacts.

The semiconductor device may further include metal interconnections provided on the contact plugs.

According to one aspect of an exemplary embodiment, there is provided a semiconductor device. The semiconductor device may include: a gate structure penetrating an interlayer insulating layer formed on a first substrate; a second substrate grown on the interlayer insulating layer; a first transistor including a first channel region in the first substrate by a bias applied to source/drain contacts penetrating the interlayer insulating layer; and a second transistor including a second channel region in the second substrate by the bias applied to the source/drain contacts and sharing the gate structure.

The gate structure may include a stacking structure of a first gate oxide layer, a first polysilicon layer, a gate metal layer, a second polysilicon layer, and a second gate oxide layer formed on the first substrate.

The first transistor may include first ion implantation regions spaced by the gate structure in the first substrate, the first gate oxide layer, the first polysilicon layer, and the gate metal layer.

The second transistor may include second ion implantation regions spaced by the gate structure in the second substrate, the second gate oxide layer, the second polysilicon layer, and the gate metal layer.

The second substrate may be grown from the first substrate to be connected to the first substrate and penetrate the interlayer insulating layer.

According to one aspect of an exemplary embodiment, there is provided a method for manufacturing a semiconductor device. The method may include: forming a first gate stack structure on a semiconductor substrate; forming first ion implantation regions in the semiconductor substrate using the first gate stacking structure as a mask; forming an interlayer insulating layer on the semiconductor substrate; forming source/drain contacts connected to the first ion implantation regions and penetrating the interlayer insulating layer; forming an oxide layer on a second gate stacking structure, in which the first gate stacking structure is partially etched, to form a gate structure; forming an epitaxial growth layer on the interlayer insulating layer using the semiconductor substrate as a seed layer; and performing ion implantation on the epitaxial grown layer to form second ion implantation regions spaced by the gate structure.

The forming a first gate stacking structure may include forming a first gate oxide layer, a first polysilicon layer, a gate metal layer, a second polysilicon layer, and a gate hard mask pattern, and etching the second polysilicon layer, gate metal layer, first polysilicon layer, and first gate oxide layer using the gate hard mask pattern as an etch mask.

The forming source/drain contacts may include etching the interlayer insulating layer to expose the first ion implantation regions, forming a metal layer on the interlayer insulating layer, and performing a planarization etch process on the metal layer to expose the interlayer insulating layer.

The performing a planarization etch process on the metal layer may include removing the gate hard mask pattern to form the second gate stacking structure.

The forming an epitaxial growth layer may include etching the interlayer insulating layer to expose the semiconductor substrate, and performing an epitaxial growth process using the semiconductor substrate as a seed layer to form the epitaxial growth layer through the etched interlayer insulating layer on the interlayer insulating layer.

The method may further include performing a planarization etch process on the epitaxial growth layer after the forming an epitaxial growth layer.

The method may further include forming an insulating layer on the epitaxial growth layer after the forming an epitaxial growth layer.

The method may further include forming contact plugs penetrating the epitaxial growth layer on the source/drain contacts.

The method may further include forming metal interconnections on the contact plugs.

A first channel region may be formed between the first ion implantation regions and a second channel region may be formed between the second ion implantation regions when a bias is applied to the source/drain contact.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
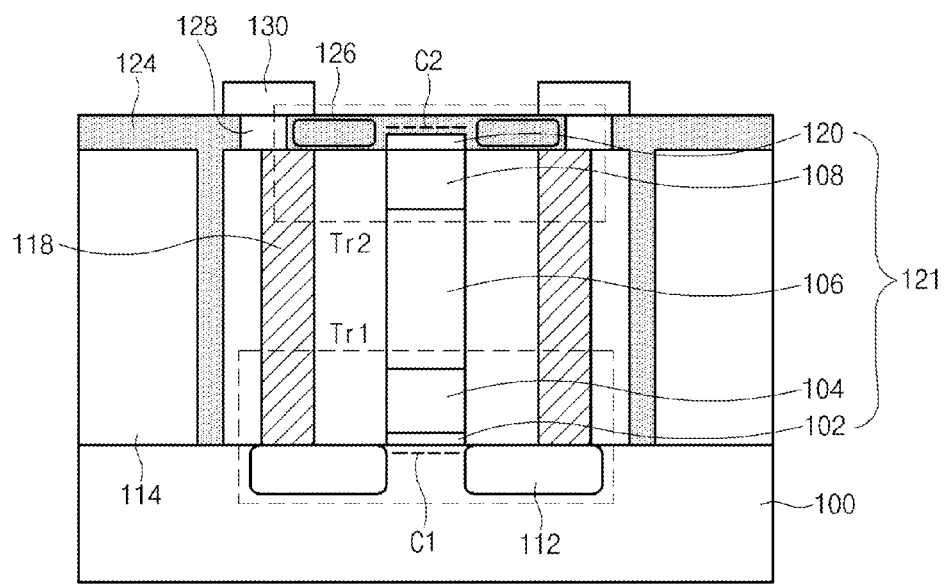
FIG. 1 is a cross-sectional view illustrating a semiconductor device according to an exemplary embodiment.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIG. 1 is a cross-sectional view illustrating a semiconductor device according to an exemplary embodiment.

As shown in FIG. 1, a semiconductor device according to the exemplary embodiment includes a gate structure 121 which penetrates an interlayer insulating layer 114 formed on a first substrate 100 including a peripheral circuit area, a second substrate 124 grown on the interlayer insulating layer 114, a first transistor Tr1 including a first channel region C1 formed in the first substrate 100 by a bias applied to source/drain contacts 118 penetrating the interlayer insulating layer 114, and a second transistor Tr2 including a second channel region C2 formed in the second substrate 124 by the bias applied to the source/drain contacts 118 and sharing the gate structure 121.

Here, the first substrate 100 may include a semiconductor substrate and the second substrate 124 may include an epitaxial growth layer grown from the semiconductor substrate and penetrating the interlayer insulating layer. The first gate structure 121 includes a stacking structure of a first gate oxide layer 102, a first polysilicon layer 104, a gate metal layer 106, a second polysilicon layer 108, and a second gate oxide layer 120 formed on the first substrate 100.

The semiconductor device further includes first ion implantation regions 112 formed in the first substrate and spaced by the gate structure 121. The semiconductor device further includes second ion implantation regions formed in the second substrate 124 and spaced by the gate structure 121.

The first transistor Tr1 may include the first ion implantation regions 112, the first gate oxide layer 102, the first polysilicon layer 104, and the gate metal layer 106. The second transistor Tr2 may include the second ion implantation regions 126, the second gate oxide layer 120, the second polysilicon layer 108, and the gate metal layer 106. That is, the first transistor Tr1 and second transistor Tr2 have a vertical symmetrical structure on the basis of the gate metal layer 106. Therefore, two transistors are formed to be vertically arranged to reduce the required area of the semiconductor substrate and to increase an effective net die area as compared to the structure in which two transistors are horizontally arranged.

The source/drain contacts 118 connect the first and second ion implantation regions 112 and 126 so that the first channel C1 is formed between the first ion implantation regions 112 and the second channel region C2 is formed between the second ion implantation regions 126, by the bias applied to the source/drain contacts 118. That is, in the semiconductor device of the exemplary embodiment, operation current is increased twice by the first and second channel regions C1 and C2, and thus operation speed of the semiconductor device is improved. Further, since the first and second channel regions C1 and C2 are formed not in a horizontal direction but instead in a vertical direction, only the source/drain contacts 118 connecting the first and second ion implantation regions 112 and 126 are required to form the channel regions. Therefore, an additional area of the semiconductor substrate is not necessary to increase the effective net die area.

The gate structure 121 may be spaced from the source/drain contacts 118, and the semiconductor device may further include contact plugs which are formed on the source/drain contacts to penetrate the epitaxial growth layer 124 and apply the bias to the source/drain contacts 118. Further, the semiconductor devices may further include metal interconnections 130 on the contact plugs 128.

A method for manufacturing the semiconductor device having the above-described configuration will be described with reference to FIGS. 2A to 2G. FIGS. 2A to 2G are cross-sectional views illustrating a semiconductor device according to an exemplary embodiment of the inventive concept. Here, for clarity, a first substrate 100 is referred to as a semiconductor substrate 100 and a second substrate 200 is referred to as an epitaxial growth layer.

Figure 2A:
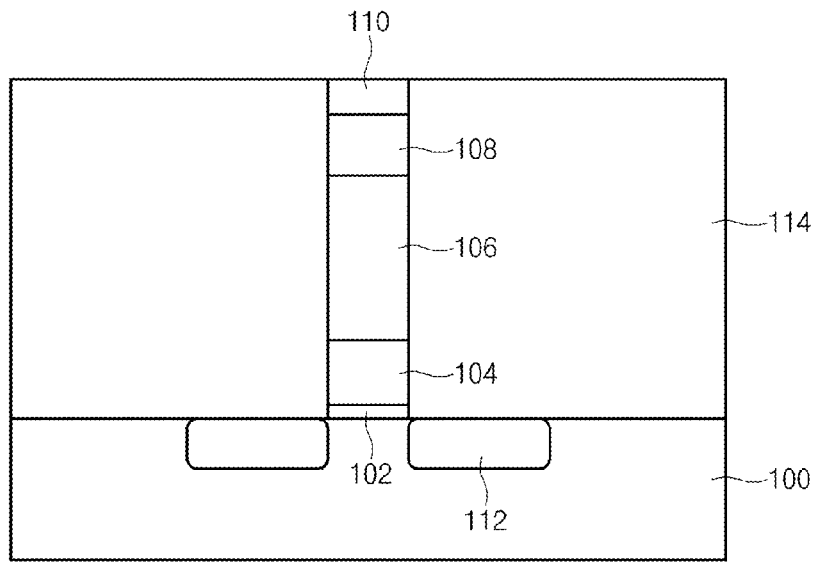
FIGS. 2A to 2G are cross-sectional views illustrating a method for manufacturing a semiconductor device according to an exemplary embodiment.

Referring to FIG. 2A, a first gate oxide layer 102 is formed on a semiconductor substrate 100 including a peripheral circuit area, a first polysilicon layer 104, gate metal layer 106, and a second polysilicon layer 108 are formed on the gate oxide layer 102, and then a gate hard mask pattern 110 is formed on the gate hard mask pattern 110. Subsequently, the second polysilicon layer 108, gate metal layer 106, first polysilicon layer 104, and the first gate oxide layer 102 are etched using the gate hard mask pattern 110 as an etch mask to form the first gate stacking structure.

Next, ion implantation is performed on the semiconductor substrate 100 using the first gate stacking structure as a mask to form first ion implantation regions 112. Here, the first ion implantation regions 112 include source/drain regions provided at both sides of the first gate stacking structure.

Subsequently, an interlayer insulating layer 114 is formed on the semiconductor substrate 100 including the first gate stacking structure. A planarization etch process may be performed on the interlayer insulating layer 114 to expose the gate hard mask pattern 110.

Figure 2B:
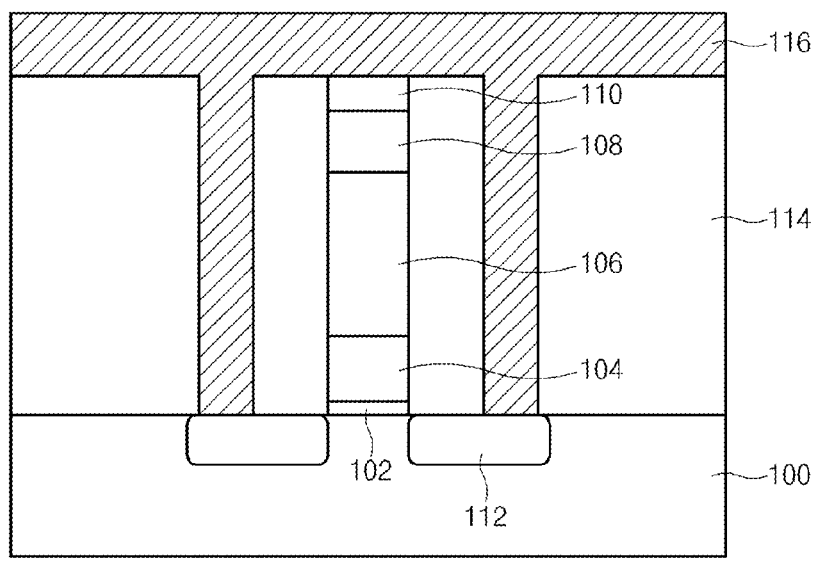

Referring to FIG. 2B, the interlayer insulating layer 114 is etched to form contacts (not shown) exposing the first ion implantation regions 112 and a metal layer 116 is formed on the interlayer insulating layer 114 to lie in the contact holes.

Figure 2C:
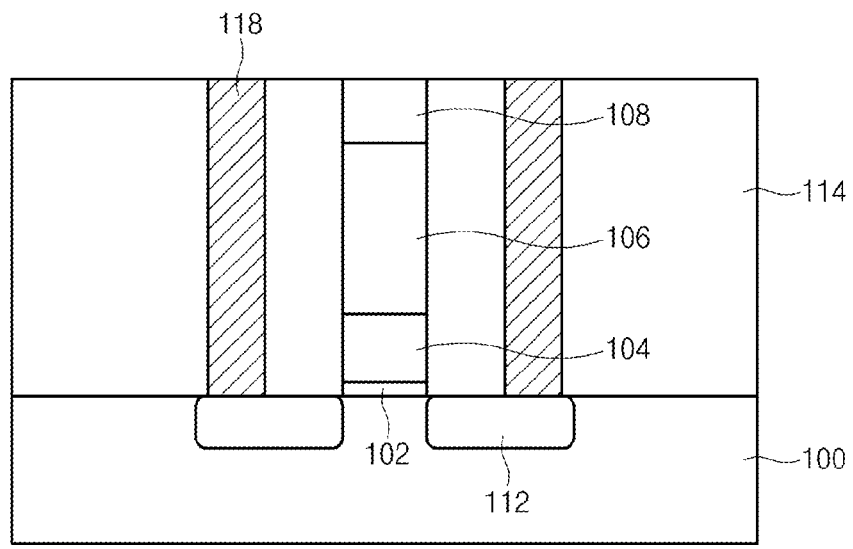

Referring to FIG. 2C, a planarization etch process is performed on the metal layer 116 to expose the interlayer insulating layer 114 and thus source/drain contacts 118 penetrating the interlayer insulating layer 114 are formed. At this time, in the planarization etch process of the metal layer 116, the gate hard mask pattern 110 of the first gate stacking structure may be removed to expose the second polysilicon layer 108. For clarity, the stacking structure in which the second polysilicon is exposed is referred to as a second gate stacking structure. The source/drain contacts 118 may be formed to be connected to the first ion implantation regions 112 formed in the semiconductor substrate.

Figure 2D:
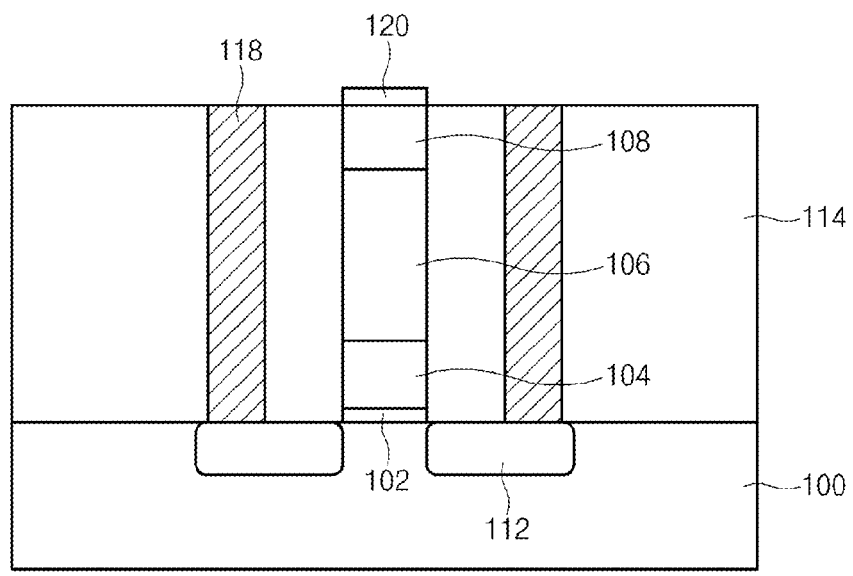

Referring to FIG. 2D, an oxidation process is performed on an upper surface of the second gate stacking structure to form a second gate oxide layer 120 on the second polysilicon layer 108. Here, the second gate oxide layer 120 may be formed through the same process as the process of forming the first gate oxide layer 102 in FIG. 2A. However, the process of forming the second gate oxide layer 120 is not limited thereto and may be changed. Therefore, the second gate oxide layer 120 in addition to the second polysilicon layer 108, the gate metal layer 106, the second polysilicon layer 104, and the first gate oxide layer 102 comprises a gate structure for operation of the semiconductor device.

Figure 2E:
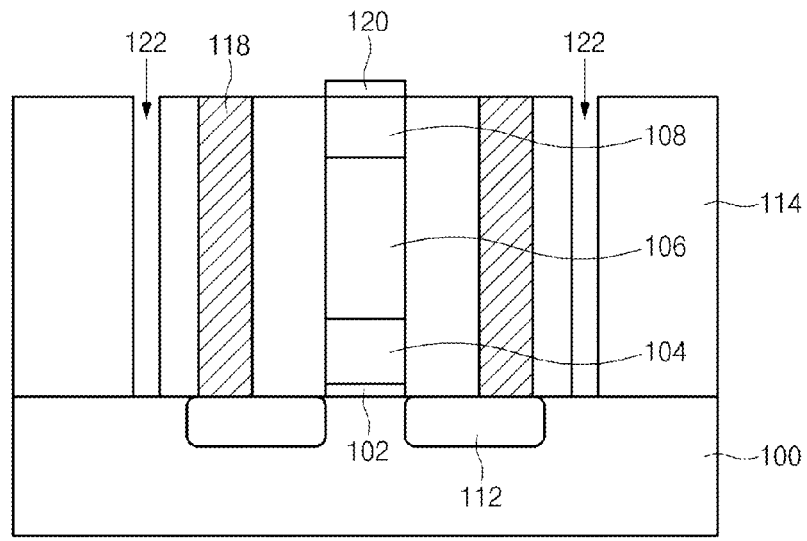

Referring to FIG. 2E, the interlayer insulating layer 114 is etched to form seed holes 122 exposing the semiconductor substrate 100. At this time, the seed holes 122 may be formed to be spaced from the source/drain contacts 118.

Figure 2F:
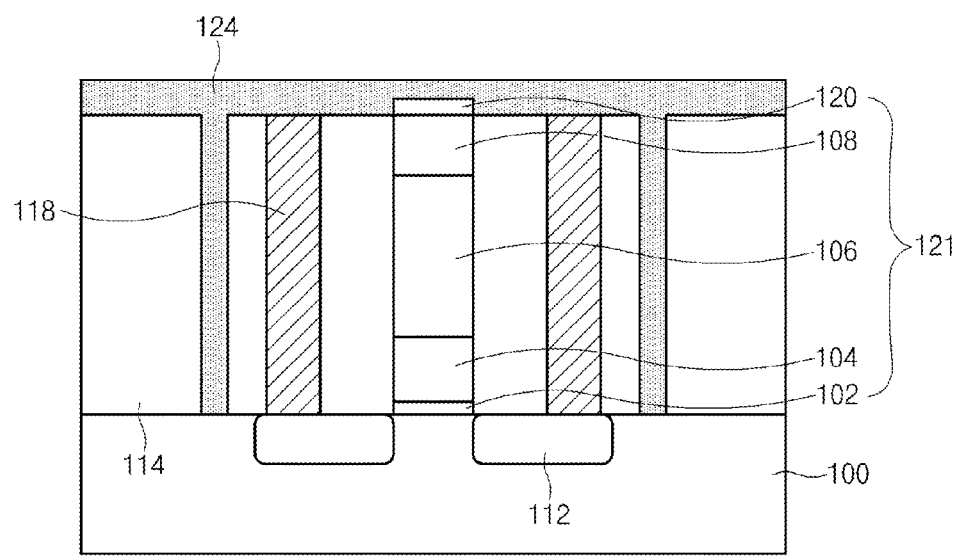

Referring to FIG. 2F, an epitaxial growth process is performed on the seed holes 122 using the semiconductor substrate 100 as a seed layer to form an epitaxial growth layer 124 on the interlayer insulating layer 114. Then, a planarization etch process may be further performed on a surface of the epitaxial growth layer 124. At this time, since an ion implantation process is subsequently performed on the epitaxial growth layer 124, the epitaxial growth layer 124 may be formed by setting a thickness thereof under the consideration of the subsequent ion implantation process. Although not shown, an interlayer insulating layer may be further formed on the epitaxial growth layer 124. The interlayer insulating layer protects the epitaxial growth layer 124 in a subsequent process.

Figure 2G:
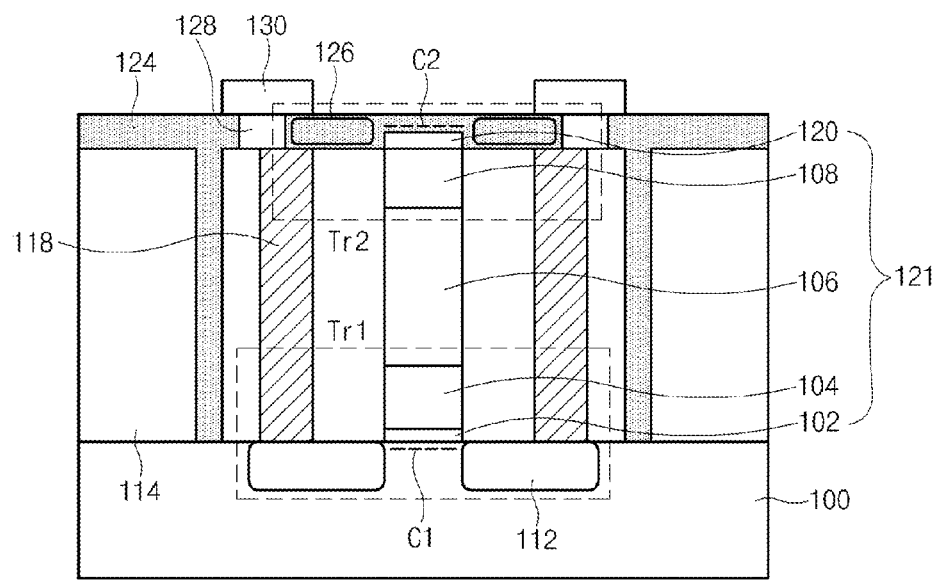

Referring to FIG. 2G, an ion implantation process is performed on the epitaxial growth layer 124 to form second ion implantation regions 126. The second ion implantation regions 126 may be formed to be spaced by the gate structure 121 and to overlap the source/drain contacts 118. That is, the first channel region C1 is formed between adjacent first ion implantation regions 112 in the semiconductor substrate 100, and a second channel region C2 is formed between adjacent second ion implantation regions 126 in the epitaxial growth layer 124, by a bias applied to the source/drain contacts 118. Therefore, when the transistor is turned on, operation current is increased twice by the first channel region C1 and by the second channel region C2 Thus, operation speed of the semiconductor device is improved.

When a first transistor Tr1 has a structure including the first ion implantation regions 112, the first gate oxide layer 102, the first polysilicon layer 104, and the gate metal layer 106, and a second transistor Tr2 has a structure including the second ion implantation regions 126, the second gate oxide layer 120, the second polysilicon layer 108, and the gate metal layer 106, the first transistor Tr1 and second transistor Tr2 have a vertical symmetrical structure on the basis of the gate metal layer 106. Therefore, two transistors are formed to be vertically arranged to reduce the required area of the semiconductor substrate and to increase an effective net die area as compared to a structure in which two transistors are horizontally arranged. Further, since the first and second channel regions C1 and C2 are formed not in a horizontal direction but instead in a vertical direction, only the source/drain contacts 118 connecting the first and second ion implantation regions 112 and 126 are required to form the channel regions. Therefore, an additional area of the semiconductor substrate is not necessary to increase the effective net die area.

Subsequently, the epitaxial growth layer 124 is etched to form contact holes exposing portions of the source/drain region contacts 118. At this time, the source/drain contacts 118 may be formed so that the source/drain contacts 118 overlap the second ion implantation regions 126. Next, a conductive material is buried in the contact holes to form contact plugs 128. Therefore, the source/drain contacts 118 may be simultaneously connected to the second ion implantation regions 126 and to the contact plugs 128.

Metal interconnections 130 are formed on the epitaxial growth layer 124 to be connected to the contact plugs 128 through patterning. The metal interconnections 130 are formed to cover portions of the second ion implantation regions 126.

As described above, in the exemplary embodiment the semiconductor substrate and the epitaxial growth layer (that is, two channel regions) are vertically formed to increase the effective net die area. Further, operation current is increased twice by the two channel regions and thus operation speed of the device is improved.

The above embodiments are illustrative and not limiting. Various alternatives and equivalents are possible. Embodiments are not limited to any specific type of semiconductor device. Other additions, subtractions, or modifications are intended to fall within the scope of the appended claims.

What is claimed is:

1. A semiconductor device, comprising:
a gate structure penetrating an interlayer insulating layer formed on a semiconductor substrate;
an epitaxial growth layer grown from the semiconductor substrate and present within the interlayer insulating layer;
a first transistor including a first channel region formed in the semiconductor substrate by a bias applied to source/drain contacts that penetrate the interlayer insulating layer; and
a second transistor including a second channel region formed in the epitaxial growth layer by the bias applied to the source/drain contacts and sharing the gate structure with the first transistor.

2. The semiconductor device of claim 1, further comprising first ion implantation regions in the semiconductor substrate and spaced by the gate structure.

3. The semiconductor device of claim 2, wherein the first channel region is formed between the first ion implantation regions.

4. The semiconductor device of claim 2, further comprising second ion implantation regions in the epitaxial growth layer and spaced by the gate structure.

5. The semiconductor device of claim 4, wherein the second channel region is formed between the second ion implantation regions.

6. The semiconductor device of claim 4, wherein the source/drain contacts connect the first ion implantation regions with second ion implantation regions.

7. The semiconductor device of claim 4, wherein the gate structure includes a stacking structure of a first gate oxide layer, a first polysilicon layer, a gate metal layer, a second polysilicon layer, and a second gate oxide layer formed on the semiconductor substrate.

8. The semiconductor device of claim 7, wherein the first transistor and the second transistor have a symmetrical structure on the basis of the gate metal layer.

9. The semiconductor device of claim 7, wherein the first transistor includes the first ion implantation regions, the first gate oxide layer, the first polysilicon layer, and the gate metal layer.

10. The semiconductor device of claim 7, wherein the second transistor includes the second ion implantation regions, the second gate oxide layer, the second polysilicon layer, and the gate metal layer.

11. The semiconductor device of claim 10, further comprising metal contacts provided on the contact plugs.

12. The semiconductor device of claim 1, wherein the epitaxial growth layer is connected to the semiconductor substrate to be grown and penetrate the interlayer insulating layer.

13. The semiconductor device of claim 1, wherein the gate structure and the source/drain contacts are spaced from each other.

14. The semiconductor device of claim 1, further comprising contact plugs penetrating the epitaxial growth layer on the source/drain contacts.

15. A semiconductor device, comprising:
first ion implantation regions provided in a semiconductor substrate;
a gate structure penetrating an interlayer insulating layer provided on the semiconductor substrate;
an epitaxial growth layer formed within the interlayer insulating layer using the semiconductor substrate as a seed layer;
second ion implantation regions provided in the epitaxial growth layer; and
source/drain contacts connecting the first and second ion implantation regions.

16. The semiconductor device of claim 15, wherein the gate structure includes a stacking structure of a first gate oxide layer, a first polysilicon layer, a gate metal layer, a second polysilicon layer, and a second gate oxide layer provided on the semiconductor substrate.

17. The semiconductor device of claim 15, wherein a first channel region is formed between the first ion implantation regions when a bias is applied to the source/drain contacts.

18. The semiconductor device of claim 15, wherein a second channel region is formed between the second ion implantation regions when a bias is applied to the source/drain contacts.

19. The semiconductor device of claim 15, wherein the gate structure is spaced from the source/drain contacts.

20. The semiconductor device of claim 15, wherein the epitaxial growth layer penetrates the interlayer insulating layer.

21. The semiconductor device of claim 15, further comprising contact plugs penetrating the epitaxial growth layer on the source/drain contacts.

22. The semiconductor device of claim 21, further comprising metal interconnections provided on the contact plugs.

23. A semiconductor device, comprising:
a gate structure penetrating an interlayer insulating layer formed on a first substrate;
a second substrate grown on the interlayer insulating layer;
a first transistor including a first channel region formed in the first substrate by a bias applied to source/drain contacts penetrating the interlayer insulating layer; and a second transistor including a second channel region formed in the second substrate by the bias applied to the source/drain contacts and sharing the gate structure with the first transistor.

24. The semiconductor device of claim 23, wherein the gate structure includes a stacking structure of a first gate oxide layer, a first polysilicon layer, a gate metal layer, a second polysilicon layer, and a second gate oxide layer formed on the first substrate.

25. The semiconductor device of claim 24, wherein the first transistor includes first ion implantation regions spaced in the first substrate by the gate structure, the first gate oxide layer, the first polysilicon layer, and a gate metal layer.

26. The semiconductor device of claim 24, wherein the second transistor includes second ion implantation regions spaced in the second substrate by the gate structure, the second gate oxide layer, the second polysilicon layer, and the gate metal layer.

27. The semiconductor device of claim 23, wherein the second substrate is grown from the first substrate to be connected to the first substrate and penetrate the interlayer insulating layer.

\* \* \* \* \*